US006621438B1

(12) United States Patent
Hong

(10) Patent No.: US 6,621,438 B1
(45) Date of Patent: Sep. 16, 2003

(54) DIGITAL-TO-ANALOG CONVERSION WITH CURRENT PATH EXCHANGE DURING CLOCK PHASES

(75) Inventor: Merit Hong, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/135,782

(22) Filed: Apr. 30, 2002

(51) Int. Cl.⁷ .............................................. H03M 1/66
(52) U.S. Cl. ...................................... 341/144; 341/153
(58) Field of Search ............................ 341/144, 153, 341/154

(56) References Cited

U.S. PATENT DOCUMENTS 4,935,740 A * 6/1990 Schouwenhaars et al. .. 341/144
6,061,010 A    5/2000 Adams et al.
6,388,598 B2 * 5/2002 Masuda ....................... 341/144
2003/0043062 A1 * 3/2003 Dedic et al. ................ 341/144

OTHER PUBLICATIONS

A 113dB SNR Oversampling DAC with Segmented Noise-–Shaped Scrambling, Feb. 5, 1998.

* cited by examiner

*Primary Examiner*—Howard L. Williams
(74) *Attorney, Agent, or Firm*—Toler, Larson & Abel, LLP

(57) ABSTRACT

An improved digital-to-analog converter (DAC) is disclosed herein. Multiple switches are used to connect a single current source to one side of a differential output when multiple bits representing the same digital value are received during successive clock cycles. By employing non-overlapping phase clocks, each of the switches can be opened and closed during an appropriate portion of a clock cycle. Using the switch arrangement disclosed herein to connect the current sources to the differential output provides the advantages of increased accuracy, low current draw, and a reduced necessity for current matching multiple current sources.

24 Claims, 9 Drawing Sheets

DIGITAL-TO-ANALOG CONVERSION WITH CURRENT PATH EXCHANGE DURING CLOCK PHASES

FIELD OF THE DISCLOSURE

The present invention relates generally to digital-to-analog converters, and more particularly to non-return to zero digital-to-analog converters.

BACKGROUND

There are at least two major concerns that must be taken into account when designing a digital-to-analog converter (DAC): accuracy and power consumption. The accuracy of a digital-to-analog converter may be expressed in terms of a signal to noise ratio, where inaccuracy is often caused by, among other things, introduction of a noise component, which reduces the signal to noise ratio and makes it difficult to distinguish a desired signal from noise. The noise component in DACs can be greatly affected by the amount of jitter in the output. The greater the jitter, the higher the noise component in the analog signal produced by the DAC. In turn, the higher noise component can lead to decreased accuracy. DACs with large signal to noise ratios are usually sought for modern applications, but achieving such accuracy can be difficult and costly.

In addition to the accuracy of the DAC, power consumption is a particularly important consideration in designing DACs for many popular devices. The less power used by a DAC the better, especially when the DAC is used in a mobile device where excess power consumption can reduce the length of time the device may be used between charging cycles. However, efficient use of power must sometimes be traded for this increased accuracy.

In applications where low power consumption DACs are particularly desirable, non-return to zero (NRTZ) DACs are normally employed because NRTZ DACs have lower peak current requirements than return to zero (RTZ) DACs. One problem with NRTZ DACs, however, is that their accuracy is affected by the pattern of the input bits. For example, an input bit pattern of 0101 causes the output of a NRTZ DAC to change three times, once each clock cycle, so that the DAC produces an output having alternating lows and highs corresponding to the logic zeros and ones of the digital input. However, with an input bit pattern of 0110, the output of an NRTZ DAC changes only twice, once early on when the bit pattern changes from 0 to 1, and then once later when the bit pattern changes from 1 back to 0.

The analog output values can differ based on the number of transitions, because of imperfections in the circuitry of the DAC. For example, real world DACs cannot produce a perfect square wave, nor are the rise and fall times of each square wave exactly equal. Since the value of the analog output is determined by the area under the curves of the square wave, and since the rise and fall times are not equal for each square wave, an input bit pattern of 0101 results in a lower overall output level at low frequency than the output level produced by the bit pattern 0110, when both of these pattern should instead produce the same result.

In order to produce their analog output value, currently available NRTZ DACs generally use differential current addition. Refer to prior art FIGS. 1 and 2 for examples of current addition. FIG. 1 represents the use of current addition to generate an output in response to a logic one input, while FIG. 2 illustrates the use of current addition to generate an output in response to a logic zero input. In FIG. 1 2X current sources 10 and 20 are connected continually to outputs 50 and 60 respectively. Current flowing out of output 50 and into output 60 represents a logic one. In order to obtain the 1X current flowing out of output 50 and into output 60, 1X current source 30 is connected to output 50 and 3X current source 40 is connected to output 60. The current from current sources 10 and 30 are added together to produce the 1X current flowing out of output 50, and the current from current sources 20 and 40 are added together to produce the current flowing into output 60.

Note that in FIG. 2 the current flow in outputs 50 and 60 is reversed from the flow shown in FIG. 1. To achieve this reverse current flow, 1X current source 30 is connected to output 60 and 3X current source 40 is connected to output 50, and the appropriate currents are summed. By switching current sources 30 and 40 appropriately, a logic one or a logic zero digital input can be represented as an analog current at outputs 50 and 60. Note that in order for current addition to work as illustrated in FIGS. 1 and 2, 4X units of current are needed.

It should be apparent therefore, that a DAC that could achieve greater accuracy than conventional NRTZ digital-to-analog converters and that use less current than those same converters, would be advantageous. If such a DAC also provided less jitter and a correspondingly reduced noise floor, then such a DAC would be even more desirable.

BRIEF DESCRIPTION OF THE DRAWINGS

Various objects, advantages, features and characteristics of the present disclosure as well as methods, operation, and functions of related elements of structure, and the combination of parts and economies of manufacture, will become apparent upon consideration of the following description and claims with reference to the accompanying drawings, all of which form a part of this specification.

DETAILED DESCRIPTION OF THE FIGURES

FIGS. 3–13 illustrate a digital-to-analog converter (DAC) using a theoretically minimum current having reduced jitter and improved signal to noise ratio characteristics as compared to conventional NRTZ type DACs. By connecting current sources to the differential output of a DAC using a different switch for even phases and odd phases of a clock signal, the DAC can produce a more accurate output than many other DACs. In addition, since different current paths are used to connect the same current source to the output during the different phases, it is not necessary to use current addition to produce an output for a single bit of digital data.

Figure 1:
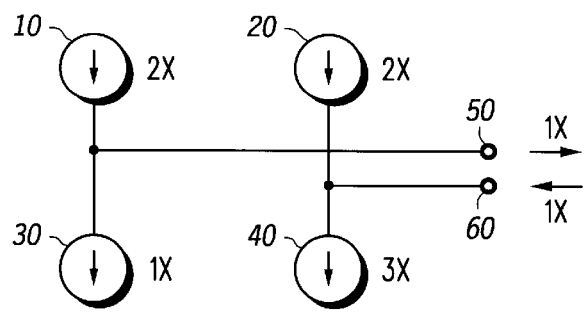
FIGS. 1 and 2 illustrate a prior art method of current addition used in non-return to zero (NRTZ) digital-to-analog converters (DAC)
Figure 2:
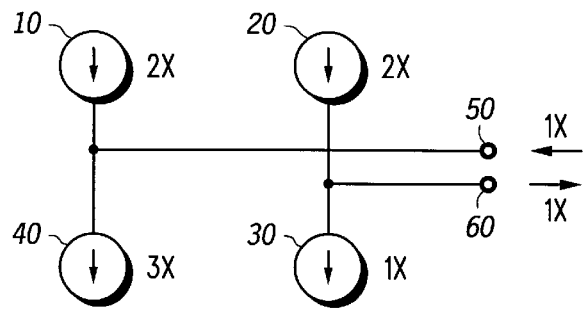
Figure 3:
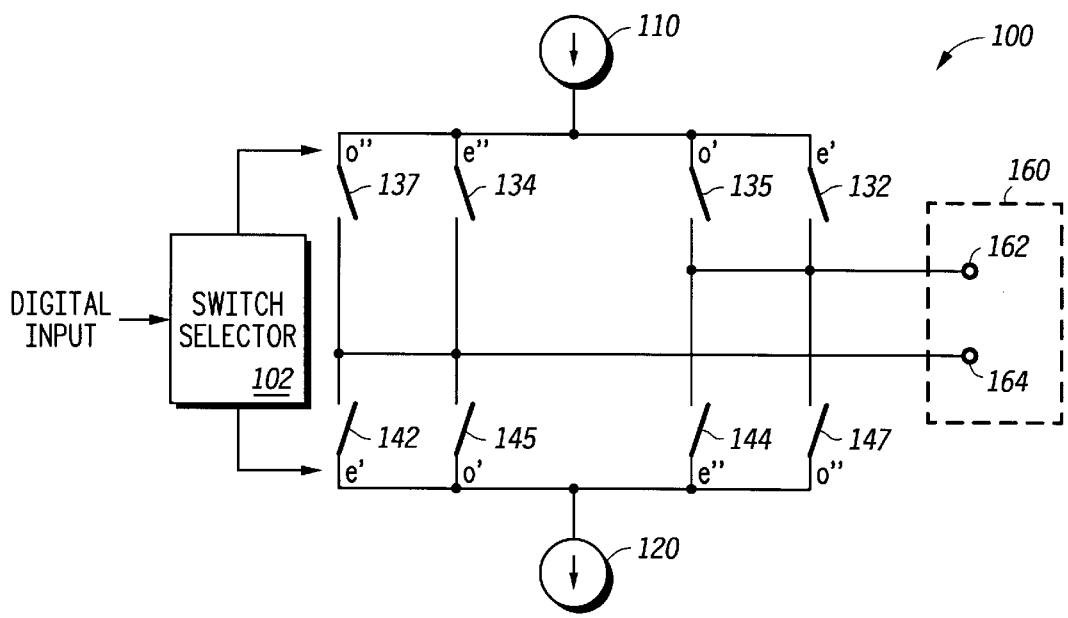
FIGS. 3–5 are block diagrams of switch configurations for use in a DAC according to one embodiment of the present invention.

Referring now to FIG. 3, a switch arrangement for use in a DAC according to an embodiment of the present invention will be discussed, and is designated generally as DAC 100. DAC 100 includes current sources 110 and 120, which are constant current sources having nominally equal outputs. DAC 100 also includes differential output 160, which has source side 162 and sink side 164; a plurality of switches 132–147 which are used to connect current sources 110 and 120 to differential output 160; and switch selector 102, which receives a digital input and includes appropriate logic to control the opening and closing of switches 132–147 at appropriate times.

Switch selector 102 can include a non-overlapping phase clock generator, as discussed subsequently, or may accept non-overlapping phase clocks as separate inputs (not illustrated). The general principles relating to controlling switches are known to those skilled in the art, and may be applied according to the teachings set forth herein to construct various embodiments of the present invention. It will also be appreciated that switches 132–147 may be constructed using various methods known to those skilled in the art. For example, each switch may be a semiconductor switch, such as a field effect transistor or a bipolar junction transistor, a mechanical switch, or any other suitable type of switch.

Switches with even numbers are used during even phases of a clock signal while switches with odd numbers are used during odd phases. The even and odd phases of a clock signal will be discussed in greater detail subsequently. In order to generate an analog output representing a digital input of 1, one unit of current should flow out of source side 162 and one unit of current should flow into sink side 164. To generate this current flow, switch 132 may be closed to connect current source 110 to differential output 160. At the same time that switch 132 is closed, switch 142 is closed to connect current source 120 to sink side 164 of differential output 160. This particular switch configuration is used during even clock phases to represent a logic 1 at the output of DAC 100.

Contrast this to the switch configuration that is used to generate a logic one at the output of DAC 100 during an odd clock phase. If a logic 1 is received during an odd clock phase, switch 135 is used to connect current source 110 to source side 162 of differential output 160 and switch 145 is used to connect current source 120 to the sink side of differential output 160.

If the digital signal being converted by DAC 100 includes two sequential logic 1's, switch 132 and 142 are used to connect sources 110 and 120 to differential output 160 during the even clock cycle in which a digital one was received, and switches 135 and 145 are used to connect current sources 110 and 120 to differential output 160 during the odd clock cycle. In at least one embodiment, switches 132 and 142 are opened prior to closing switches 135 and 145, so that only one of the switches 132 or 135, and one corresponding switch 142 or 145, will be closed at any one time. By controlling the switches in this way, the low frequency output of DAC 100, in response to a pattern including sequential 1's, for example 0110, will more closely approximate the output produced by DAC 100 for sequences containing only alternating 1's, such as bit pattern 0101. In this way the accuracy of DAC 100 is enhanced.

The sequence of operations for generating an analog output in response to a logic 0 input is analogous to that discussed in the previous paragraph. In order to generate an output corresponding to a logic 0, current flows out of sink side 164 of differential output 160 and into source side 162 of differential output 160. In order to accomplish this during even clock phases, switches 134 and 144 are used to connect current sources 110 and 120 to differential output 160, while during odd phases 137 and 147 are used to connect current sources 110 and 120 to differential output 160. Note that since current addition is not used, fewer current sources are needed. Consequently, exacting component matching becomes less critical in achieving an accurate output.

Figure 4:
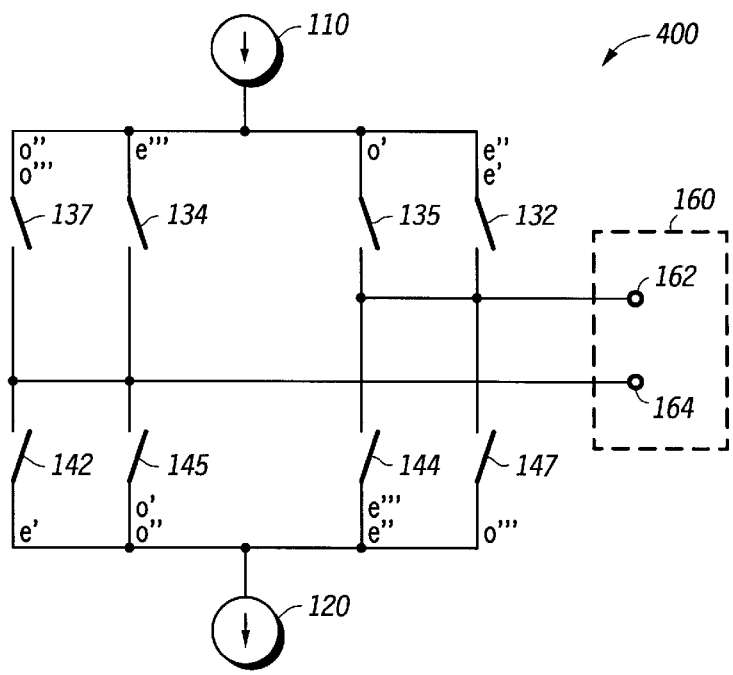

Referring next to FIG. 4, a method of using the switch arrangement discussed in FIG. 3 to implement a three level DAC is disclosed according to one embodiment of the present invention. It will become apparent when considering the following discussion, that many of the same principles used for the two-level DAC output discussed with reference to FIG. 3, apply equally to the three-level DAC output of FIG. 4.

When using the illustrated switch configuration as shown in FIG. 4, output levels of +1 (one unit of positive current flow), −1 (one unit of negative current flow) and an intermediate output level (substantially no current flow) can be generated by opening and closing particular switches at appropriate times. Generation of the +1 and −1 output levels is accomplished in an identical manner to the method described with reference to FIG. 3 for generating outputs in response to logic 1's and logic 0's. Recall, for example, that switches 132 and 142 are used to produce one unit of positive current flow in response to logic 1 inputs during even clock phases, and switches 135 and 145 are used to produce one unit of positive current flow in response to logic 1 inputs during odd clock phases. Recall also that to produce one unit of negative current flow in response to a logic 0 input during even clock phases, switches 134 and 144 are used to connect sources 110 and 120 to output 160, while switches 137 and 147 are used during odd clock phases.

Now that it is apparent how two of the three output levels (+1 and −1) are generated, all that remains is to determine how to produce the intermediate output level, represented by substantially no current flow. In at least one embodiment, the intermediate output level is generated by closing additional switches, such that the current provided to output 160 essentially cancels out. Consider, for example, the case where an intermediate output level is to be generated during an even phase. Switches 132 is closed, thereby providing one unit of positive current flow into source side 162, and switch 144 is also closed, thereby providing one unit of negative current flow to source side 162, for a net current flow into source side 162 of zero. Since no current flows into or out of sink side 164, the currents from sources 110 and 120 effectively cancel out, leaving substantially no current flowing into or out of output 160, and generating the intermediate output level. Switches 137 and 145 can be used in a similar manner to generate an intermediate output during odd clock phases.

By manipulating the switches in the illustrated switch configuration is such a manner, no one switch remains closed for consecutive even and odd clock cycles, and so many of the advantages of the two-level DAC discussed with reference to FIG. 3 are also obtained by using the illustrated switch configuration in a three-level DAC as illustrated in FIG. 4.

Figure 5:
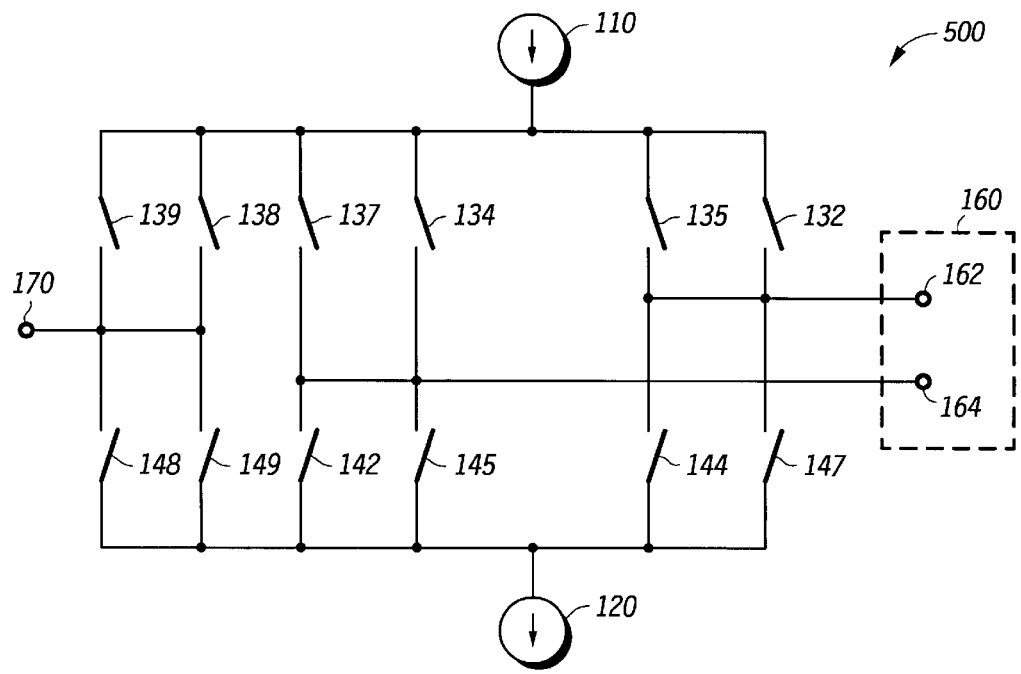

Referring next to FIG. 5, another switch configuration for use in a three output-level DAC is discussed according to one embodiment of the present invention. As in the use of the switch configuration discussed in FIG. 4, the switch configuration illustrated in FIG. 5 can be used to generate three output levels +1, −1 and an intermediate, or 0, level. Unlike the switch configuration illustrated in FIG. 4, however, the switch configuration of FIG. 5 includes non-differential output 170, in addition to source side 162 and drain side 164 of differential output 160. The method by which the illustrated switch configuration can be used to generate the +1 output level and the −1 output level have been previously disclosed, so the following discussion focuses on generating the intermediate level output.

By using a separate non-differential output 170, the intermediate-level output can be made closer to zero than can normally be accomplished when using differential output 160 as discussed in FIG. 4. The reason for this is that small differences between current sources 110 and 120 are directed to non-differential output 170; hence no small differences exist at any output of differential output 160, and thus differential output 160 is even closer to true zero.

In at least one embodiment, however, more switches are required when non-differential output 170 is employed. In order to generate an intermediate output level during an even phase, switches 138 and 148 are closed to connect both current source 110 and current source 120 to non-differential output 170. Switches 139 and 149 are used during odd phases. In this way, the contribution of non-differential output 170 is maintained very close to zero.

It will be appreciated that the switch configurations discussed in both FIGS. 4 and 5 permit use of three-level outputs without requiring current sources 110 and 120 to be switched on or off, which can be advantageous in many applications. In addition, the methods and switch configurations discussed in reference to FIGS. 3–5 can be expanded for use in DACs having additional output nodes. In general, a switch configuration employing the teachings set forth herein can be constructed for a DAC having N output nodes, by providing 2N switches per current source.

Figure 6:
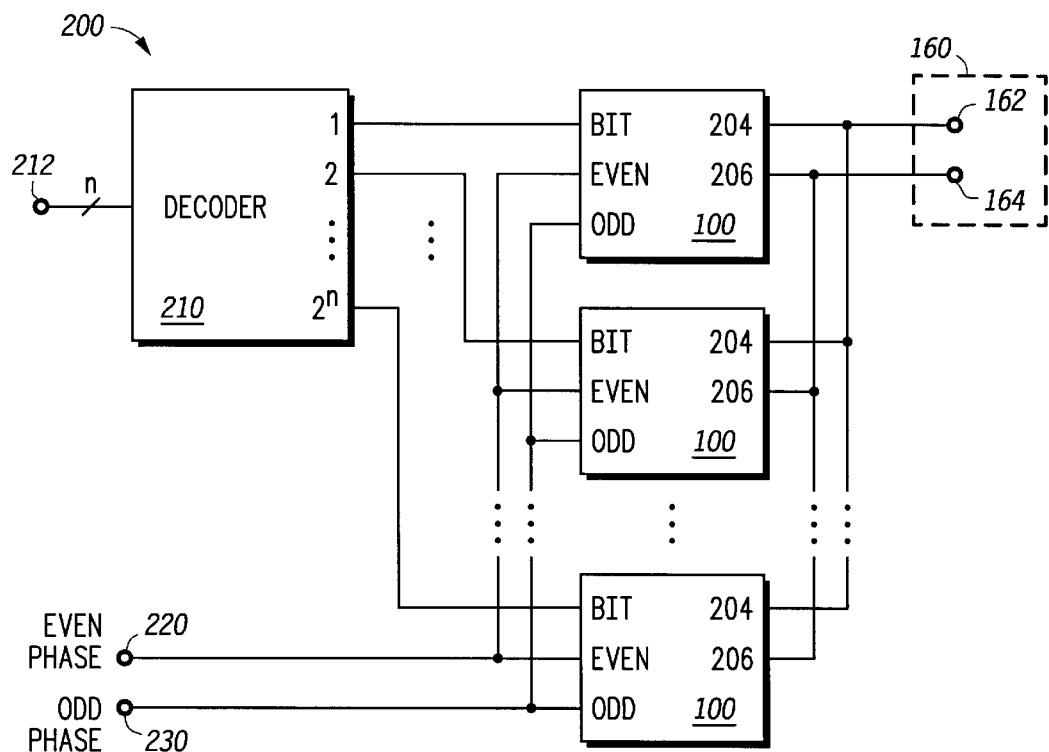
FIG. 6 is a block diagram of a DAC including multiple switch banks according to one embodiment of the present invention.

Referring now to FIG. 6 multiple DACs 100 are arranged for use in an n-bit DAC according to an embodiment of the present invention. N-bit DAC 200, as illustrated in FIG. 6, includes even phase input 220 and odd phase input 230 for receiving non-overlapping phase clock signals. In addition, n-bit DAC 200 includes a binary to unary converter 210 to receive an n-bit binary encoded digital signal and convert the encoded digital signal into single bits for use in DACs 100. The outputs 204 and 206 of each DAC 100 are connected in parallel to differential output 160 which include source side 162 and sink side 164 as discussed in relation to FIG. 3. In considering the following discussion, it will be appreciated that although n-bit binary encoding is used for illustrative purposes, n-bit DAC 200 could also be used to decode digital signals using alternate encoding schemes, such as a thermometer unary code for use by DACs 100.

In operation, n-bit DAC 200 performs as follows. A digital signal, which may be formatted as N bits of binary code, is received at input 212. Assume, for example, that N=2, which implies that 2 bits of data can represent the numbers 0 through 3, with the bit pattern 00 representing a value of 0, the bit pattern 01 representing a value of 1, the bit pattern 10 representing a value of 2, and the bit pattern 11 representing a value of 3. Assume furthermore that the output of n-bit DAC 200 is interpreted as follows: an output current of −3 represents a value of 0, an output current of −1 represents a value of 1, an output current of +1 represents a value of 2, and an output current of +3 represents a value of 3. Binary to unary converter 210 converts the n-bit digital signal at input 212 into separate unary signals for use by DAC 100 and sends appropriate digital bits to particular DACs 100 so that the output at differential output 160 represents the value indicated by the bit pattern received at input 212.

For example, assume that the signal received at input 212 has a value of 2, represented by a bit pattern of 10. Binary to unary converter 210 sends a digital 1 to two of the DACs 100, and a digital 0 to a third DAC 100. Sending 1's to two of DACs 100 and a 0 to the other DAC 100 causes two of the DACs 100 to push current out of source side 162 and pull current into sink side 164. The third DAC to pushes current out of sink side 164 and pulls current into source side 162. The result is a net current flow of +1 out of differential output 160. Still assuming N=2, a bit pattern of 00 at input 212 will cause binary to unary converter 210 to send a 0 bit to all of the DACs 100, with each DAC producing one unit of current flowing out of sink side 164 and into source side 162, for a net current flow of −3 out of differential output 160.

Similar examples can be constructed for different values of N, by considering that each of the DACs 100 can contribute either a +1 current flow or a −1 current flow to differential output 160 so that, for example, when N=1 only a single DAC 100 is needed to produce 2' different output levels at differential output 160, when N=3, seven DACs 100 will be necessary to generate $2^3$ or 8 different output levels at differential output 160, and so on.

While binary to unary converter 210 controls whether a 1 or a 0 is delivered to each of the DACs 100, even phase input 220 and odd phase input 230 provide the non-overlapping clock signals to DACs 100 to control which switches within DAC 100, discussed in FIG. 3, are used to connect current sources to differential output 160. The use of even/odd clock phases and non-overlapping clock signals will be discussed next.

Figure 7:
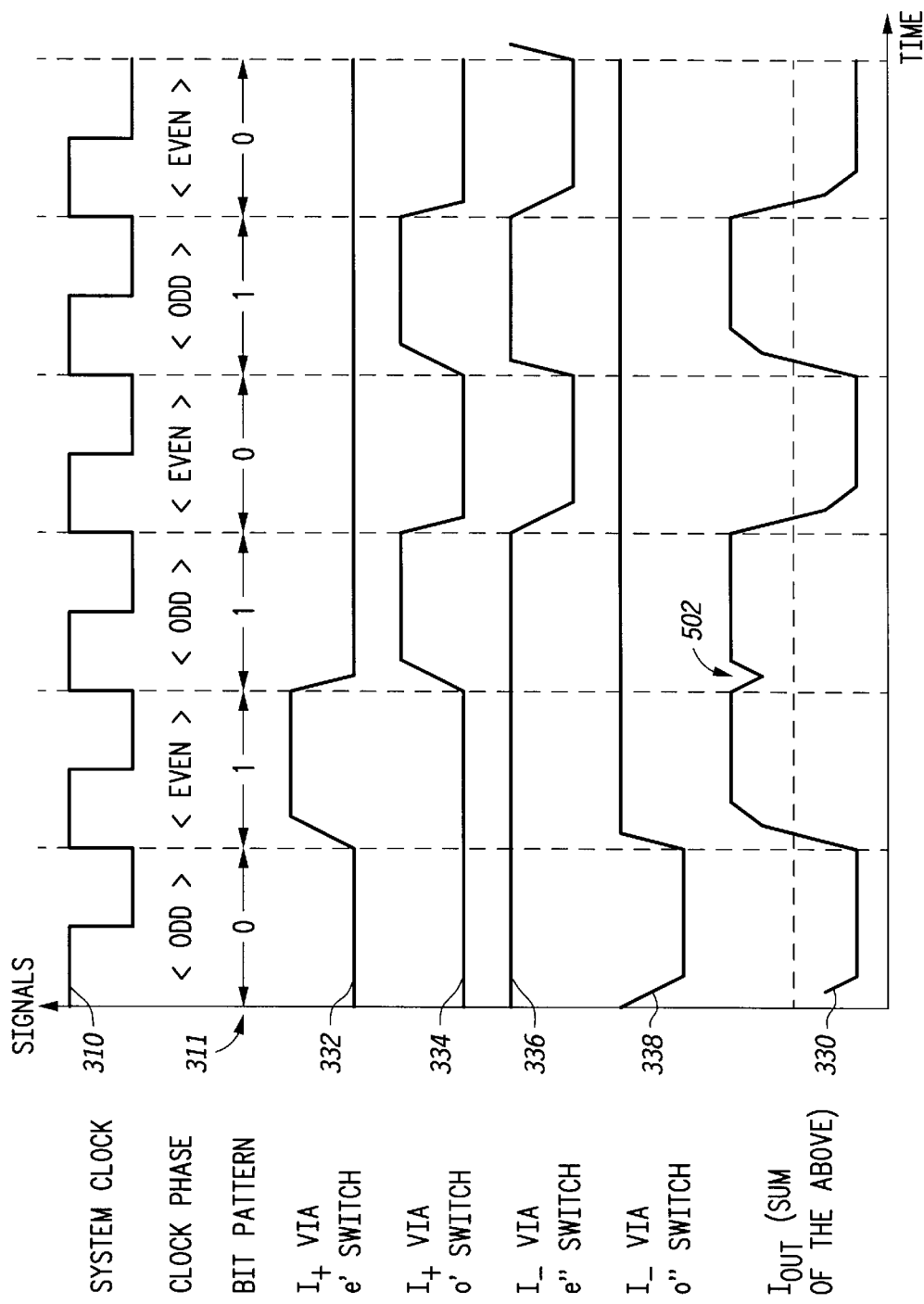
FIG. 7 is a timing diagram, according to one embodiment of the present invention, illustrating how signals generated by individual switches contribute to the composite output signal generated by the switch configuration shown in FIG. 3, wherein the signals generated by individual switches have a long rise time, a short fall time, and a negligible delay between the opening of one switch and the closing of another.

Referring now to FIG. 7, the timing of a switch arrangement such as that shown in DAC 100 of FIG. 3 will be discussed according to an embodiment of the present disclosure in which the rise time of signals contributed by individual switches and/or switch pairs is longer than the fall time. Timing in FIG. 7 is discussed with reference to system clock 310. Each cycle of system clock 310 is labeled directly under system clock 310 as being either an even phase or an odd phase, and an input bit pattern 311 indicates whether a high or low input is received during each clock cycle. Output signal 330 is the output generated by DAC 100 (FIG. 3) for the indicated bit pattern of 0-1-1-0-1-0, and is generated by summing the contributions from each of the switches. Switch output 332 represents the positive current contribution provided to the output when switches 132 (FIG. 3) and 142 (FIG. 3) are closed, which occurs only when a 1 input is received during an even clock phase; switch output 334 illustrates the positive current contribution provided to the output when switches 135 (FIG. 3) and 145 (FIG. 3) are closed, which occurs only when a 1 input is received during an odd clock phase; switch output 336 illustrates the negative current contribution provided to the output when switches 134 (FIG. 3) and 144 (FIG. 3) are closed, which occurs only when a 0 input is received during an even clock phase; and switch output 338 represents the contribution provided to the output when switches 137 (FIG. 3) and 147 (FIG. 3) are closed, which occurs only when a 0 input is received during an odd clock phase.

Since the first 0 is received during an odd phase, switches 137 and 147 are closed so that switch output 338 contributes a negative unit of current flow to the output, while switch outputs 332, 334, and 336 make no contribution. The resulting output signal 330 is, therefore one unit of negative current in response to the logic 0 received during the first odd clock cycle. The second clock cycle is an even clock cycle, and the second bit of the input bit pattern is a 1, so switch output 332 contributes one positive unit of current to the output. No other switches are closed, so the other switch outputs 334, 336, and 338 do make any contribution to the output during the second clock cycle. Switch output 334 contributes one unit of positive current flow during each of the odd phases where the input bit pattern indicates a 1, and switch output 336 contributes one unit of negative current flow during each of the odd clock cycles in which the input bit pattern indicates a 0.

For the case where switch delays are negligible with respect to rise and fall times, the sum of all of the switch outputs 332–338 is shown by output signal 330. An advantage of at least one embodiment of the present disclosure will become apparent upon consideration of output signal 330. Note that by using different switch pairs for even clock phases than are used for odd clock phases, sequential 1's in the input bit pattern produce an output having a notch 502. Notch 502 is produced because the rise and fall times of the positive pulses of switch outputs 332 and 334 are not essentially identical to each other. The presence of notch 502 allows the area under the portion of output signal 330 generated in response to the bit pattern 0-1-1-0 to be substantially the same as the area under the portion of output signal 330 generated in response to the bit pattern 1-0-1-0. Unlike the embodiment of the present invention being discussed, a prior art NRTZ DAC would not produce notch 502 in response to consecutive 1's. As a result, prior art NRTZ DACs are more susceptible to inaccuracies in their low frequency outputs, because different low frequency output levels might be produced in response to different low frequency input bit patterns, when in fact the different low frequency bit patterns should result in the same low frequency output. As illustrated, notch 502 does not last long enough to allow the current transients of the falling output signal to reach their minimum value. Instead the trailing edge of the output signal is allowed to fall only a short time before the next switch is closed, and the current flow through differential output 160 is increased once again. By opening the first set of switches and then closing the next set of switches before the current transients from the previous portion of the output signal are allowed to die completely, the effect of jitter in the output can be minimized by maximizing the amount of time current flows. It will be apparent upon further consideration of FIG. 7 and the foregoing discussion that although the response to a sequence of consecutive 1's is used as an example, at least one embodiment of the present invention will produce a notch similar to notch 502 in response to consecutive 0's in the input bit pattern. In addition, it will be appreciated that a notch 502 will be produced between three, four, or any number of consecutive 1's or consecutive 0's.

Figure 8:
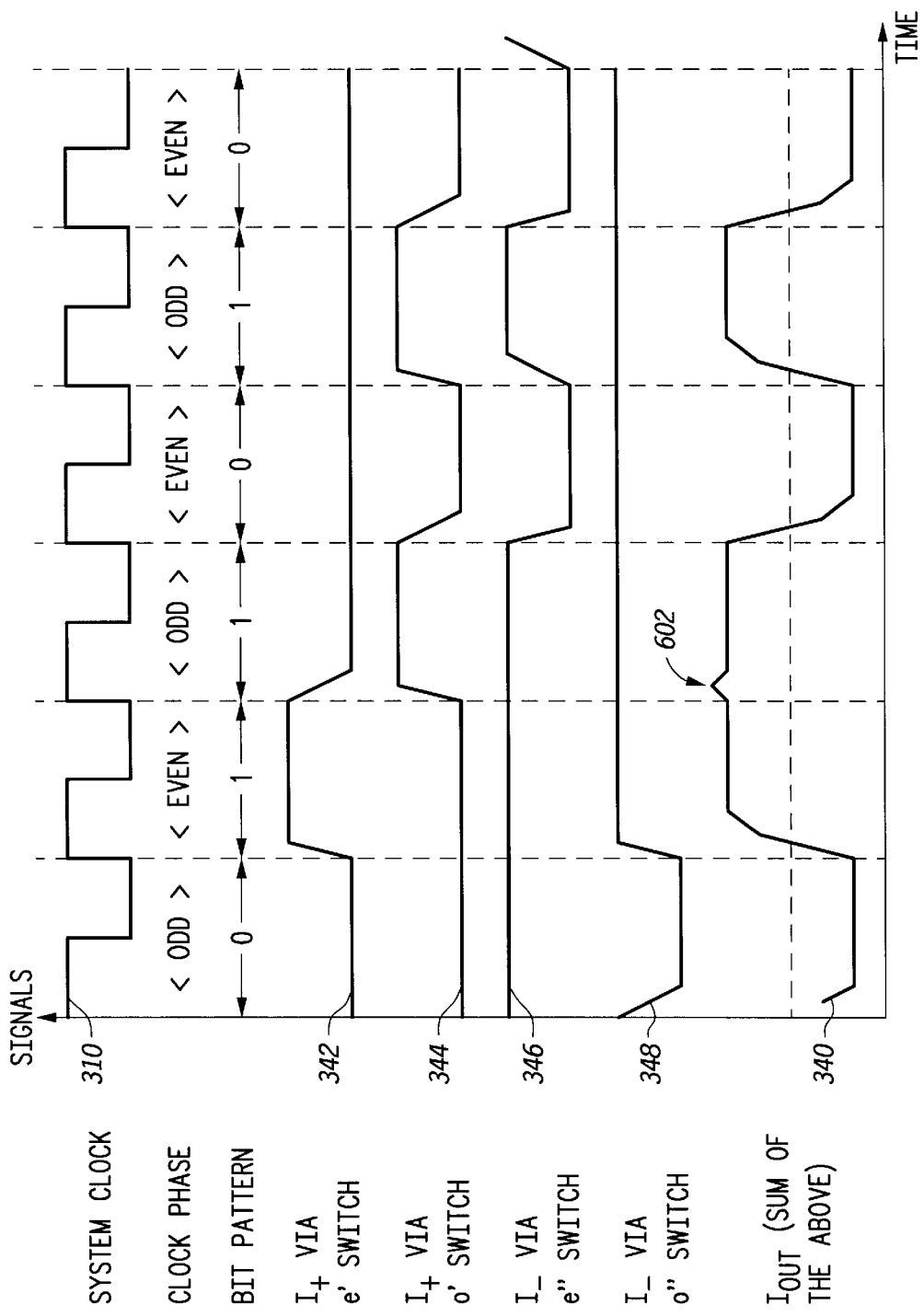
FIG. 8 is a timing diagram, according to one embodiment of the present invention, illustrating how signals generated by individual switches contribute to the composite output signal generated by the switch configuration shown in FIG. 3, wherein the signals generated by individual switches have a short rise time, a long fall time, and a negligible delay between the opening of one switch and the closing of another.

Referring next to FIG. 8, the timing of a switch arrangement, such as that illustrated by DAC 100 of FIG. 3, will be discussed according to an embodiment of the present invention in which the rise time of signals contributed by individual switches and/or switch pairs is shorter than their fall time, and in which switching delays are negligible with respect to rise and fall times. Recall that FIG. 7 illustrated the case where the rise time was longer than the fall time. Also recall that when the contributions of the switch outputs of FIG. 7 were combined to generate an output signal, a notch was produced in the output when consecutive bits in the input bit pattern were the same. In contrast to the case discussed in FIG. 7, when the rise times of the switch contributions are shorter than the fall times, as shown in FIG. 8, a ridge 602 is produced in output 340 in response to consecutive 1's or 0's in the input it pattern.

Switch outputs 342, 344, 346 and 348 are generated in the same way as discussed with reference to FIG. 7, and are combined to produce an output according to the same principles previously discussed. Additionally, the ridge 602 produced by combining the switch outputs 342–348 causes bit patterns including large low-frequency components to be more accurate, in a way similar to the way in which notch 502 in FIG. 7 enhances accuracy.

It should be appreciated that for each bit, an isolated pulse is produced, complete with all of its rise, fall, and delay times; hence interference between adjacent pulses is avoided. It will also be appreciated that the rise times and fall times of various switch arrangements may be affected by the type of technology used in constructing the switch, as well as various other design, fabrication, and/or application parameters. For example, a switch composed of p-channel Metal Oxide Semiconductor (PMOS) and n-channel Metal Oxide Semiconductor (NMOS) transistors will generally produce different rise times and fall times than a switch arrangement composed of NMOS transistors alone.

Figure 9:
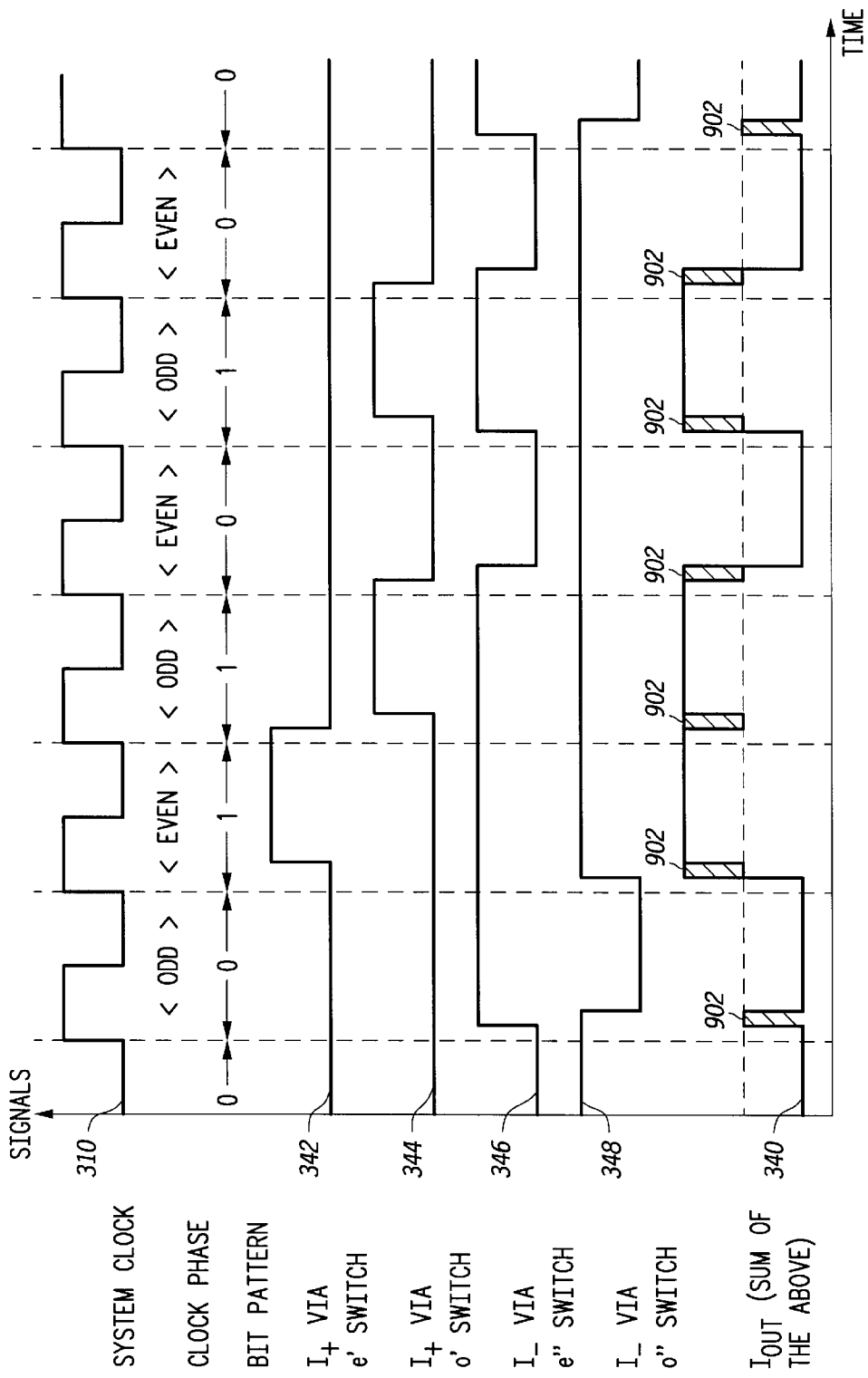
FIG. 9 is a timing diagram, according to one embodiment of the present invention, illustrating how signals generated by individual switches contribute to the composite output signal generated by the switch configuration shown in FIG. 3, wherein the difference between the rise and fall times of signals generated by individual switches is negligible, and the delay between the opening of one switch and the closing of another is non-negligible.

Referring now to FIG. 9, the combined output signal of a switch arrangement will be discussed according to one embodiment of the disclosure. System clock 310, as well as switch outputs 342, 344, 346 and 348 are identical to the same signals discussed with reference to FIGS. 7 and 8, except that the rise and fall times of the individual switch signals 342–348 are negligible compared to the delay introduced between the opening of a first switch at the end of a phase and the closing of a second switch at the beginning of the complementary phase. For example, recall from the discussion of FIG. 3, that in at least one embodiment, switches 132 and 142 (FIG. 3) are closed during an even phase where a logic one is represented. Recall further that if a logic one is received during the next odd phase, switches 132 and 142 (FIG. 3) are opened, and switches 135 and 145 (FIG. 3) are closed after a short delay. This delay is related to the delay introduced by the non-overlapping phase clocks, discussed subsequently.

The effect of the delay between the opening of one set of switches and the closing of another is represented by areas 902. During the time period between the opening of switches 132, 142 (FIG. 3) and the closing of switches 135, 145 (FIG. 3), the amount of current contributed to combined output 340 by the individual switch outputs is zero, as shown by areas 902. Because typical NRTZ digital-to-analog converters do not include areas 902, the analog response of typical NRTZ digital-to-analog converters differs, depending on whether the digital input pattern includes a high frequency pattern of alternating, predominantly non-repeated logic levels, or whether the digital input pattern includes a high frequency pattern of alternating, predominantly repeated logic levels. Areas 902 allow the combined output generated in response to be consistent, regardless of whether the digital input signal primarily includes repeating or non-repeating logic levels.

Figure 10:
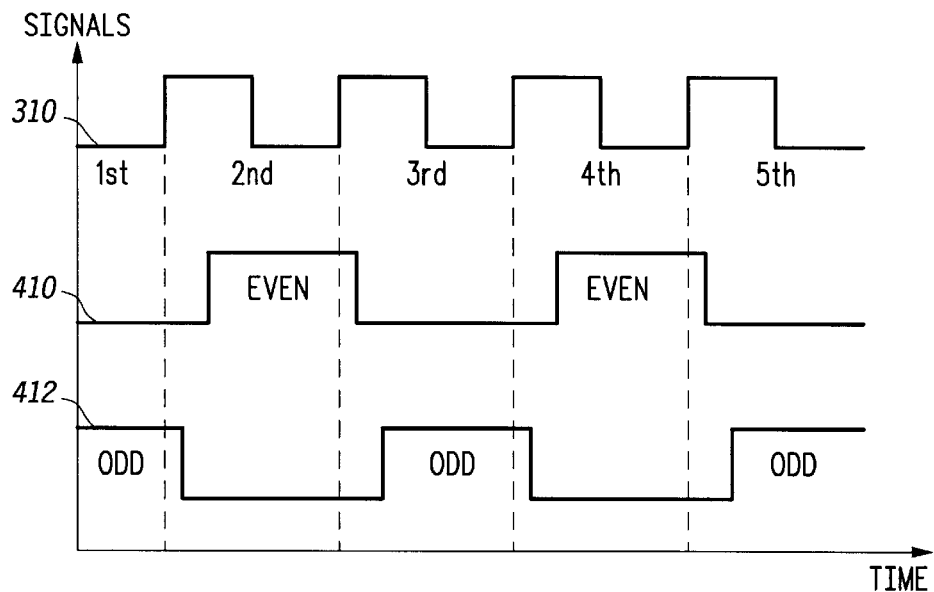
FIG. 10 is a timing diagram illustrating a non-overlapping phase clock according to one embodiment of the present invention.

Referring next to FIG. 10, the non-overlapping phase clocks used to control the opening and closing of switches within DAC 100 (FIG. 3) will be discussed according to one embodiment of the present disclosure. The timing in FIG. 9 will be discussed with reference to clock 310 which is shown as having a first, second, third, fourth, and fifth cycle. Even-phase clock 410 goes high during the second and fourth cycles of clock 310, while odd-phase clock 412 goes high during the first, third, and fifth cycles of clock 310. Notice that the start of each even and odd pulse is delayed by an amount sufficient to ensure that the opposite phase clock has had time to return to its zero value, thereby ensuring that the even and odd clock cycles do not overlap, and that at no time will the switches controlled by even-phase clock 410 be closed at the same time as the switches controlled by odd-phase clock 412.

For example, odd-phase clock 412 is high during the first cycle of clock 310. When the second cycle of clock 310 begins, odd-phase clock 412 drops low, which takes a certain amount of time. Even-phase clock 410 is delayed from going high until after odd-phase clock 412 has already gone low. After odd-phase clock 412 goes low, even-phase clock 412 can then go high, indicating to DAC 100 (FIG. 3) that the second clock cycle is an even clock cycle. It will be appreciated by those skilled in the art that if a logic level is received every half clock cycle rather than every entire clock cycle, even clock 410 and odd clock 412 may correspond to even and odd portions of a single clock cycle rather than only full clock cycles as illustrated in FIG. 6.

Figure 11:
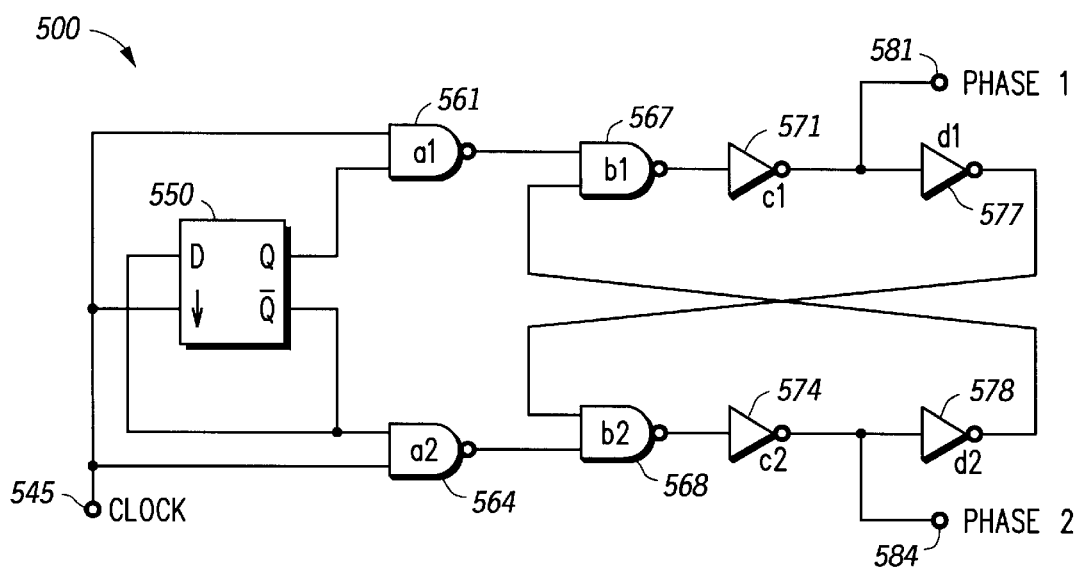
FIG. 11 is a logic diagram illustrating a logic configuration to generate a non-overlapping phase clock as illustrated in FIG. 9, according to at least one embodiment of the present invention.
Figure 12:
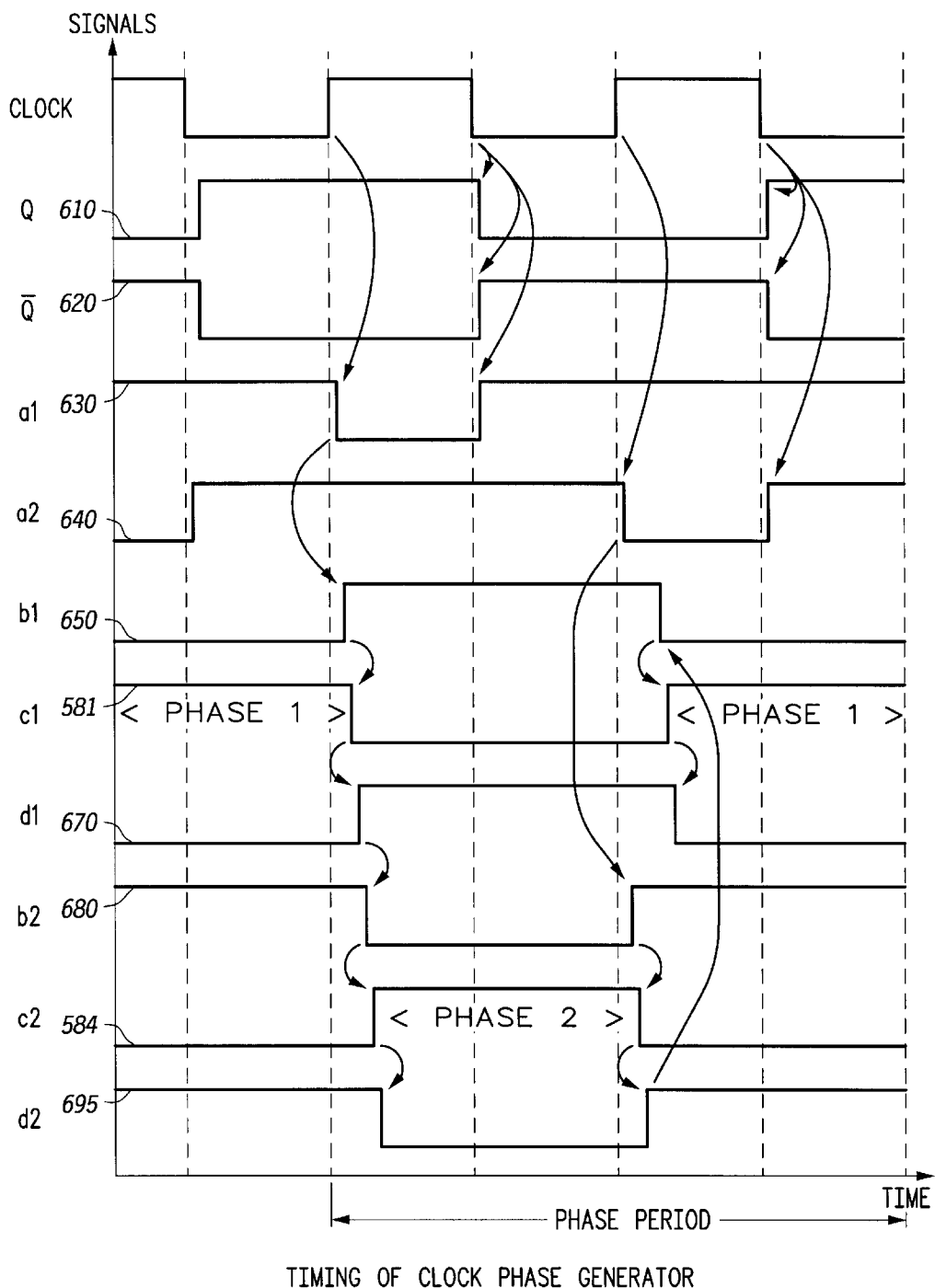
FIG. 12 is a timing diagram illustrating the timing of the non-overlapping phase clock generation circuit illustrated in FIG. 10.

Referring now to FIGS. 11 and 12, a timing diagram and a circuit 500 for generating non-overlapping clock signals will be discussed according to one embodiment of the present invention. Assume, for example, that phase-one output 581 is high during the first half of a clock cycle, as shown in FIG. 11. In that case, the phase-two output 584 must be low, since both phase-one output 581 and phase-two output 584 are never high at the same time. The beginning conditions of the other logic gates are as follows: the Q 610, which is the Q output of flip-flop 550 is low; the QNOT 620, which is the QNOT output of flip-flop 550 is high; signal 630, which is the output of NAND gate 561, is high; signal 640, which is the output of NAND gate 564, is low; signal 650, which is the output of NAND gate 567 is low; signal 680, which is the output of NAND gate 568 is high; signal 670, which is the output of inverting gate 577 is low; and signal 695, which is the output of inverting gate 578 is high.

Approximately half-way through the initial clock cycle, the falling edge of the clock triggers flip-flop 550, causing Q 610 and QNOT 620 to change states. The change in state of Q 610 from low to high does not change the output of NAND gate 561, which remains high, but does change the output of NAND gate 564.

The rising edge of the clock signal at the end of the initial clock cycle does not trigger flip-flop 550. However, the transition of the clock signal causes signal 630, the output of NAND gate 561, to drop low. The change in signal 630 causes NAND gate 567 to change state, which in turn causes, inverting gate 571 to change state, thereby causing phase-one output 581 to go low, indicating the end of phase one. The output of inverting gate 571 is fed into inverting gate 577 causing signal 670 to go high. Signal 670 is connected to one input of NAND gate 568. Consequently, the change in signal 670 from low to high causes signal 680 to drop low. The changes propagate through inverting gates 574 and 578, causing phase-two output 584 to go high, and signal 695 to drop low. Phase-two output 584 going high indicates the beginning of a second clock phase. A similar logic pattern is executed to change from phase one to phase two.

Note that phase-one output 581 and phase-two output 584 will not both be high at the same time, as discussed with reference to FIG. 10. It will be appreciated that phase clock circuit 500 is exemplary only, and that other circuits may be used to provide a delay suitable to ensure that even and odd phase clocks do not overlap, and that these other suitable circuits may be constructed according to principles generally know to those skilled in the art.

Figure 13:
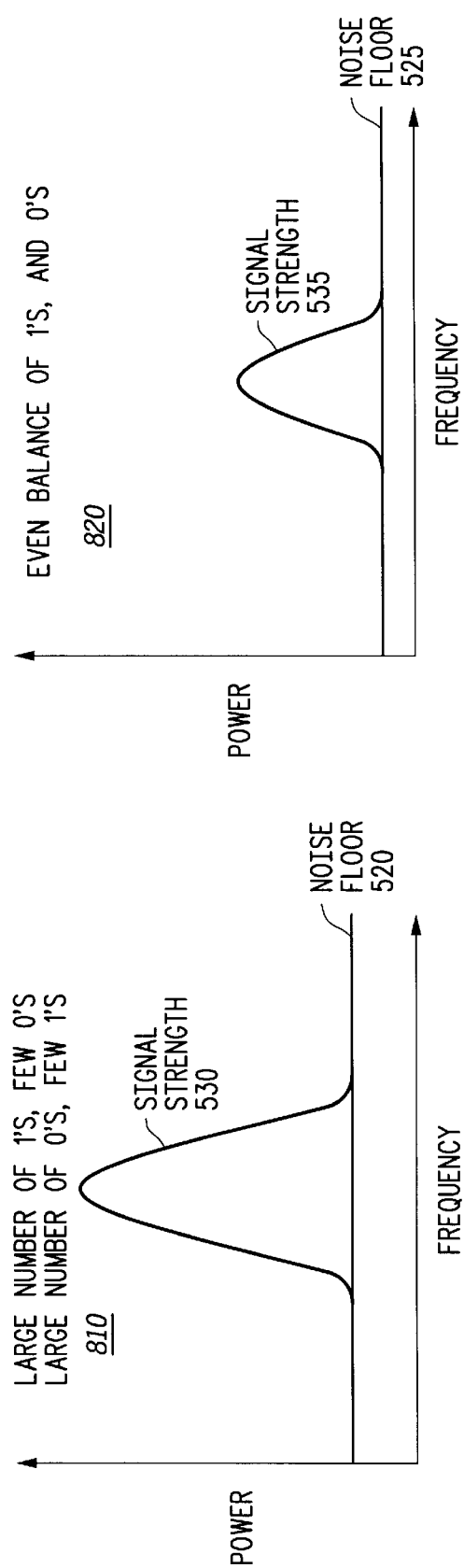
FIG. 13 includes comparative graphs illustrating how the number of digital 1's and 0's in the input affect the output power and noise of a DAC according to an embodiment of the present invention.

Referring now to FIG. 13, an advantage of a DAC according to an embodiment of the present invention will be discussed. Graphs 810 and 820 illustrate the power distributions of signals generated by a DAC constructed according to an embodiment of the present invention. Graph 810 illustrates the case where the input is "unbalanced," that is where the input includes a large number of 1's and few 0's or a large number of 0's and few 1's. Graph 820, conversely, illustrates the power distribution of a DAC according to an embodiment of the present invention when the input to the DAC is an evenly balanced number of 1's and 0's. For example, graph 810 might correspond to an input bit pattern of 011110, while graph 820 might correspond to an input bit pattern of 010101.

When there are a large number of 1's or a large number of 0's and relatively few of the opposite, the signal strength 530 of the output is relatively high. The noise floor 520 is also relatively higher than the noise floor that would be generated by an even balance of 1's and 0's as shown in graph 820. However, signal strength 530 is large enough to be easily distinguished over noise floor 520. Note that in graph 820, signal strength 535 is reduced from signal strength 530. However noise floor 525 is correspondingly reduced from noise floor 520, so that signal strength 535 is also easily distinguishable above noise floor 525 in much the same way as signal strength 530 is distinguishable over noise floor 520. In effect, at least one embodiment of the present invention has the advantage of lowering the noise floor as the signal strength of the output is decreased, which can improve accuracy and prevent misidentification of output values.

In summary it should be apparent from a review of the foregoing disclosure that various advantages can be achieved by using a multiple switch configuration as illustrated in FIG. 3. By requiring fewer sources, so that current addition is not necessary, the matching of the current sources becomes less critical. In addition less current is used than by many other DAC configurations, and the DAC configuration discussed herein also provides for low frequency noise cancellation of the current sources.

In the preceding detailed description of the figures, reference has been made to the accompanying drawings which form a part thereof, and in which is shown by way of illustrations specific embodiments in which the invention may be practiced. These embodiments are described in sufficient detail to enable those skilled in the art to practice the invention, and it should be understood that other embodiments may be utilized and that logical, mechanical, chemical, and electrical changes may be made with out departing from the spirit or scope of the invention. To avoid detail not necessary to enable those skilled in the art to practice the invention, the description may omit certain information known to those skilled in the art. Furthermore, many other varied embodiments that incorporate the teachings of the invention may be easily constructed by those skilled in the art. According, the present disclosure is not intended to be limited to the specific form set forth herein, but on the contrary, it is intended to cover such alternatives, modifications, and equivalents as can be reasonably included within the spirit and scope of the invention. The preceding detailed description is therefore not to be taken in a limiting sense and the scope of the present disclosure is defined only by the appended claims.

What is claimed is:

1. A method comprising:
   receiving a digital signal representing a sequence of logic levels, wherein a first portion of the digital signal represents a first logic level and a second portion of the digital signal represents the same logic level as the first portion of the digital signal;
   connecting a first current source to a first output via a first current path in response to the first portion of the digital signal;
   disconnecting the first current source from the first output; and
   reconnecting the first current source to the first output via a second current path in response to the second portion of the digital signal.

2. The method as in claim 1, wherein the step of reconnecting is performed before a current transient on the first current path returns to zero.

3. The method as in claim 1, wherein the first portion of the digital signal and the second portion of the digital signal are identified relative to an even phase of a clock signal and an odd phase of a clock signal, respectively.

4. The method as in claim 3, wherein:
   the odd phase of the clock signal includes a first clock cycle, a third clock cycle and subsequent odd numbered clock cycles; and
   the even phase of the clock signal include a second clock cycle, a fourth clock cycle and subsequent even numbered clock cycles.

5. The method as in claim 1, further including the steps of:
   generating non-overlapping clock signals; and
   timing the steps of connecting and reconnecting using the non-overlapping clock signals.

6. The method as in claim 1, wherein:
   the first current source is connected via the first current path by a first switch; and
   the first current source is reconnected via the second current path by a second switch different from the first switch.

7. The method as in claim 1, further including the steps of:
   connecting a second current source to a second output via a third current path in response to the first portion of the digital signal;

disconnecting the second current source from the second output; and reconnecting the second current source to the second output via a fourth current path in response to the second portion of the digital signal.

8. An apparatus comprising:

an input to receive a digital signal;

a clock input;

a first differential output;

a first plurality of switches to couple a first current source to said differential output exclusively during even clock phases in response to a digital signal;

a second plurality of switches to couple said first current source to said differential output exclusively during odd clock phases in response to the digital signal;

a third plurality of switches to couple a second current source to said differential output exclusively during even clock phases in response to the digital signal; and a fourth plurality of switches to couple said second current source to said differential output exclusively during odd clock phases in response to the digital signal.

9. The apparatus as in claim 8, wherein:

said first differential output includes a source side and a sink side; and said first plurality of switches includes:
a first switch to couple said first current source to said source side of said differential output in response to a digital signal indicative of a first logic level during even clock phases;
a second switch to couple said first current source to said sink side of said differential output in response to a second logic level during even clock phases;
said second plurality of switches includes:
a third switch to couple said first current source to said source side of said differential output in response to a digital signal indicative of the first logic level during odd clock phases; and
a fourth switch to couple said first current source to said sink side of said differential output in response to a digital signal indicative of the second logic level during odd clock phases.

10. The apparatus as in claim 9, wherein:

said first differential output includes a source side and a sink side; and said third plurality of switches includes:
a fifth switch to couple said second current source to said source side of said differential output in response to a digital signal indicative of the second logic level during even clock phases;
a sixth switch to couple said second current source to said sink side of said differential output in response to the first logic level during even clock phases;
said fourth plurality of switches includes:
a seventh switch to couple said second current source to said source side of said differential output in response to a digital signal indicative of the second logic level during odd clock phases; and
an eighth switch to couple said second current source to said sink side of said differential output in response to a digital signal indicative of the first logic level during odd clock phases.

11. The apparatus as in claim 8, wherein:

more than one logic signal causes a particular switch of said first plurality of switches to couple said first current source to said differential output;

more than one logic signal causes a particular switch of said second plurality of switches to couple said first current source to said differential output;

more than one logic signal causes a particular switch of said third plurality of switches to couple said second current source to said differential output; and more than one logic signal causes a particular switch of said fourth plurality of switches to couple said second current source to said differential output.

12. The apparatus as in claim 8, further including:

a second differential output in parallel with said first differential output;

a fifth plurality of switches to couple a third current source to said differential output exclusively during even clock phases;

a sixth plurality of switches to couple said third current source to said differential output exclusively during odd clock phases;

a seventh plurality of switches to couple a fourth current source to said differential output exclusively during even clock phases; and an eighth plurality of switches to couple said fourth current source to said differential output exclusively during odd clock phases.

13. The apparatus as in claim 8, further including:

a non-differential output;

a fifth plurality of switches to couple a first current source to said non-differential output exclusively during even clock phases in response to a digital signal; and a sixth plurality of switches to couple said first current source to said non-differential output exclusively during odd clock phases in response to the digital signal.

14. The apparatus as in claim 8, further including a binary to unary converter to convert a binary digital signal into a plurality of unary digital signals.

15. The apparatus as in claim 8, further wherein said clock input includes a plurality of inputs to receive non-overlapping clock signals indicating even phases of a clock signal and odd phases of a clock signal.

16. An apparatus comprising:

an input to receive a digital input signal;

an output to provide an analog representation of the digital input signal, said output having a first side and a second side;

a first set of switches including:
a plurality of switches to couple a first current source to said first side when said digital input signal represents a logic one;
a plurality of switches to couple the first current source to said second side when said digital input signal represents a logic zero;
a second set of switches including:
a plurality of switches to couple a second current source to said second side when said digital input signal represents a logic one; and
a plurality of switches to couple the second current source to said first side when said digital input signal represents a logic zero; and
said first set of switches and said second set of switches configured to couple said current sources to said output using different switches for even clock phases and odd clock phases.

17. The apparatus as in claim 16, wherein:
said first side is one of a source and a sink; and
said second side is the other of a source and a sink.

18. The apparatus as in claim 16, wherein said first set of switches includes:
a first switch to connect the first current source to said first side during even clock phases when said digital signal represents a logic one;
a second switch to connect the first current source to said first side during odd clock phases when said digital signal represents a logic one;
a third switch to connect the first current source to said second side during even clock phases when said digital signal represents a logic zero; and
a fourth switch to connect the first current source to said second side during odd clock phases said digital signal represents a logic zero.

19. The apparatus as in claim 16, wherein said second set of switches includes:
a first switch to connect the second current source to said second side during even clock phases when said digital signal represents a logic one;
a second switch to connect the second current source to said second side during odd clock phases when said digital signal represents a logic one;
a third switch to connect the second current source to said first side during even clock phases when said digital signal represents a logic zero; and
a fourth switch to connect the second current source to said first side during odd clock phases when said digital signal represents a logic zero.

20. The apparatus as in claim 16, wherein:
more than one digital input signal causes a particular switch of said first set of switches to couple said first current source to said output; and
more than one digital input signal causes a particular switch of said second set of switches to couple said second current source to said output.

21. The apparatus as in claim 16, further including an input to receive non-overlapping clock signals indicating even phases of a clock signal and odd phases of a clock signal.

22. The apparatus as in claim 16, further including a binary to unary converter to convert a binary digital signal into a plurality of unary digital signals.

23. The apparatus as in claim 22, further including:
a third set of switches including:
a plurality of switches to couple a third current source to said first side when one of said unary digital signals represents a logic one;
a plurality of switches to couple the third current source to said second side when one of said unary digital signals represents a logic zero;
a fourth set of switches including:
a plurality of switches to couple a fourth current source to said second side when one of said unary digital signals represents a logic one; and
a plurality of switches to couple the fourth current source to said first side when one of said unary digital signals represents a logic zero; and
said third set of switches and said fourth set of switches configured to couple said current sources to said output using different switches for even clock phases and odd clock phases.

24. The apparatus as in claim 16, further including:
an intermediate-level output;
a third set of switches to couple said first current source to said intermediate-level output when said digital input signal represents an intermediate logic level; and
a fourth set of switches to couple said second current source to said intermediate-level output when said digital input signal represents an intermediate logic level; and
said third set of switches and said fourth set of switches configured to couple said current sources to said output using different switches for even clock phases and odd clock phases.

* * * * *